United States Patent
Datla et al.

(10) Patent No.: US 8,848,478 B2
(45) Date of Patent: Sep. 30, 2014

(54) POWER CONSUMPTION CONTROL

(71) Applicants: Krishnam R. Datla, San Jose, CA (US);
William H. Radke, Los Gatos, CA (US);
Robin Sarno, Pleasanton, CA (US);
Laszlo Borbely-Bartis, Santa Clara, CA (US); Ken Kannampuzha, Fremont, CA (US)

(72) Inventors: Krishnam R. Datla, San Jose, CA (US);
William H. Radke, Los Gatos, CA (US);
Robin Sarno, Pleasanton, CA (US);
Laszlo Borbely-Bartis, Santa Clara, CA (US); Ken Kannampuzha, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 13/625,104

(22) Filed: Sep. 24, 2012

(65) Prior Publication Data
US 2014/0086000 A1    Mar. 27, 2014

(51) Int. Cl.
*G11C 5/14*      (2006.01)

(52) U.S. Cl.
CPC ........................................ *G11C 5/14* (2013.01)
USPC ........... 365/227; 365/226; 365/228; 365/229; 365/233.1; 365/233.11

(58) Field of Classification Search
CPC ......... G06F 1/263; G06F 1/30; G06F 1/3203; G06F 13/4243; H04L 41/0856; G11C 13/0004
USPC ......... 365/227, 226, 228, 229, 233.1, 233.11, 365/233.12
See application file for complete search history.

(56) References Cited

U.S. PATENT DOCUMENTS

| | | | |
|---|---|---|---|
| 2009/0089602 A1 | 4/2009 | Bose et al. | |
| 2011/0122691 A1 | 5/2011 | Sprouse | |
| 2011/0283128 A1 | 11/2011 | Farhan et al. | |
| 2012/0125710 A1* | 5/2012 | Fisk et al. | ..................... 181/290 |
| 2012/0159057 A1 | 6/2012 | Loh et al. | |

OTHER PUBLICATIONS

U.S. Appl. No. 13/561,632, entitled "Apparatus Power Control," filed Jul. 30, 2012, 26 pages.
U.S. Appl. No. 13/600,311, entitled "Sequence Power Control," filed Aug. 31, 2012, 22 pages.

* cited by examiner

*Primary Examiner* — Thong Q Le
(74) *Attorney, Agent, or Firm* — Brooks, Cameron & Huebsch, PLLC (57) ABSTRACT

The present disclosure includes apparatuses and methods for power consumption control. A number of embodiments include determining power consumption information for each phase in a combination of phases of a command, and authorizing execution of at least one of the phases in the combination based, at least partially, on the power consumption information determined for the at least one of the phases.

39 Claims, 3 Drawing Sheets

| COMMAND | PHASES | | | | | | | | | | |
|---|---|---|---|---|---|---|---|---|---|---|---|
| SINGLE PLANE WRITE 352-1 | DT-1 346-1 | AP-1 348-1 | | | | | | | | | |
| DUAL PLANE WRITE 352-2 | DT-1 346-1 | DT-2 346-2 | AP-1 348-1 | | | | | | | | |
| QUAD PLANE WRITE 352-3 | DT-1 346-1 | DT-2 346-2 | DT-3 346-3 | DT-4 346-4 | AP-1 348-1 | | | | | | |
| OCTAL PLANE WRITE 352-4 | DT-1 346-1 | DT-2 346-2 | DT-3 346-3 | DT-4 346-4 | DT-5 346-5 | DT-6 346-6 | DT-7 346-7 | DT-8 346-8 | AP-1 348-1 | | |
| SINGLE PLANE READ 354-1 | AS-1 350-1 | DT-1 346-1 | | | | | | | | | |
| DUAL PLANE READ 354-2 | AS-1 350-1 | DT-1 346-1 | DT-2 346-2 | | | | | | | | |
| QUAD PLANE READ 354-3 | AS-1 350-1 | DT-1 346-1 | DT-2 346-2 | DT-3 346-3 | DT-4 346-4 | | | | | | |
| OCTAL PLANE READ 354-4 | AS-1 350-1 | DT-1 346-1 | DT-2 346-2 | DT-3 346-3 | DT-4 346-4 | DT-5 346-5 | DT-6 346-6 | DT-7 346-7 | DT-8 346-8 | | |

*Fig. 3*

POWER CONSUMPTION CONTROL

TECHNICAL FIELD

The present disclosure relates generally to apparatuses, such as semiconductor memory devices, systems, and controllers, and related methods, and more particularly, to power consumption control.

BACKGROUND

Memory devices are typically provided as internal, semiconductor, integrated circuits in computers or other electronic devices. There are many different types of memory including volatile and non-volatile memory. Volatile memory can require power to maintain its information, e.g., data, and includes random-access memory (RAM), dynamic random access memory (DRAM), synchronous dynamic random access memory (SDRAM), and static random access memory (SRAM) among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), resistive random access memory (RRAM), and phase change random access memory (PCRAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory. Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

An SSD can be used to replace hard disk drives as the main storage device for a computing system, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include a number of memory devices, e.g., a number of memory chips. As one of ordinary skill in the art will appreciate, a memory chip can include a number of dies and/or logical units (LUNs), e.g., where a LUN can be one or more die. Each die can include a number of memory arrays and peripheral circuitry thereon. The memory arrays can include a number of memory cells organized into a number of physical pages, and the physical pages can be organized into a number of blocks. An array of flash memory cells can be programmed a page at a time and erased a block at a time. Controlling power consumption of operations, e.g., read, write, and erase, performed on an SSD can provide benefits such as conserving battery power, among other benefits.

DETAILED DESCRIPTION

The present disclosure includes apparatuses and methods for power consumption control. A number of embodiments include determining power consumption information for each phase in a combination of phases of a command, and authorizing execution of at least one of the phases in the combination based, at least partially, on the power consumption information determined for the at least one of the phases.

In a number of embodiments, executing a command can include execution of a number of phases, e.g., execution phases. Example execution phases include a data transfer phase, an array program phase, and an array sense phase, for instance. Various combinations of execution phases can be executed to execute commands on a memory system. Each phase of the number of phases can consume an amount of power during execution and can be assigned an amount of power credits that designate the amount of power consumed by the phase upon execution. In a number of embodiments, a command can be comprised of a combination of a number of phases, e.g., a number data transfer phases and an array program phase. Each of the number of phases can be assigned a particular amount of power credits. As an example, a data transfer phase can be assigned 10 power credits, an array program phase can be assigned 4 power credits, and an array sense phase can be assigned 2. However, embodiments are not limited to this example.

In a number of embodiments, power consumption information, which can include an amount of power credits assigned to each phase, can be stored in a data structure, e.g., look-up table, on a controller, for instance. A number of combinations of phases can be executed, e.g., performed, to execute commands, such as read, write, and/or erase commands, for example, on a memory system. The controller can receive a command and separate the command into a combination of phases. The controller can locate power consumption information for the number of phases in the data structure, e.g., look-up table, and the power consumption information can be used by a memory system to regulate power consumption of the memory system when executing the number of phases.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more of such things.

For example, a number of memory devices can refer to one or more memory devices. As used herein, the designator "N", particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

Figure 1:
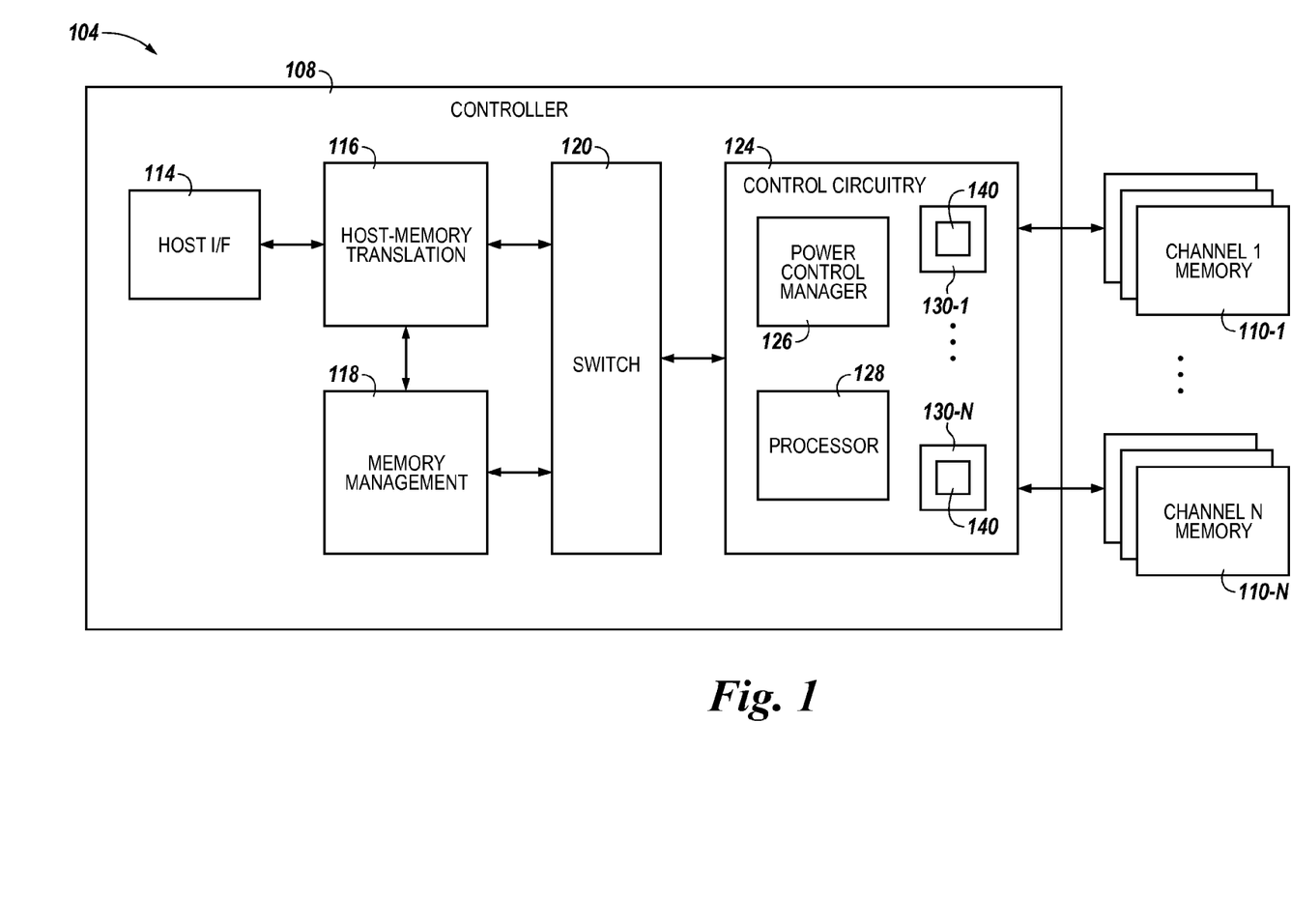
FIG. 1 is a block diagram of an apparatus in the form of a memory system in accordance with a number of embodiments of the present disclosure.

FIG. 1 is a block diagram of an apparatus in the form of a memory system 104 in accordance with a number of embodiments of the present disclosure. As used herein, a memory system 104, a controller 108, or a memory device 110 might also be separately considered an "apparatus." The memory system 104 can be used as an external, e.g., portable, memory system for a computing system. The memory system 104, e.g., a solid state drive (SSD), can include controller 108 coupled to memory, e.g., a number of solid state memory devices 110-1, . . . , 110-N. The solid state memory devices 110-1, . . . , 110-N can provide a storage volume for the memory system 104. In a number of embodiments, the number of memory devices 110-1, . . . , 110-N can include non-volatile memory including a number of logical units (LUNs). A LUN can be a portion of non-volatile memory that can be independently controllable. Also, the controller can include volatile and/or non-volatile memory.

A solid state memory device 110-1, . . . , 110-N can include a number of arrays of memory cells, e.g., non-volatile memory cells. The arrays can be flash arrays with a NAND architecture, for example. In a NAND architecture, the control gates of memory cells of a "row" can be coupled with an access, e.g., word, line, while the memory cells can be coupled in series source to drain in a "string" between a select gate source transistor and a select gate drain transistor. The string can be connected to a data, e.g., bit, line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The solid state memory devices 110-1, . . . , 110-N can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can store 4320 bytes of information per page, 128 pages per block, 2048 blocks per plane, and 16 planes per device.

In FIG. 1, channel 1 memory 110-1 can include a number of dies of memory cells that are coupled to the memory system 104 via channel 1 and channel N memory 110-N can include a number of dies of memory cells that are coupled to the memory system 104 via channel N. Channel 1 memory 110-1 can be associated with channel controller 130-1 and channel N memory 110-N can be associated with channel controller 130-N on control circuitry 124. In a number of embodiments, each channel associated with a solid state memory device, such as solid state memory devices 110-1, . . . , 110-N in FIG. 1, can be associated with a channel controller. The channel controller can be used to execute a number of phases of the commands received at each channel.

The controller 108 can include host interface (I/F) 114, host-memory translation circuitry 116, memory management circuitry 118, a switch 120, and/or control circuitry 124. As described herein, portions of controller 108 can be provided in the form of an ASIC, however, embodiments are not so limited.

The controller 108 can communicate with the solid state memory devices 110-1, . . . , 110-N to read, write, and erase information, among other operations. The controller 108 can have firmware and/or circuitry that may be a number of integrated circuits and/or discrete components. For a number of embodiments, the circuitry in controller 108 may include control circuitry 124 for controlling access across the solid state memory devices 110-1, . . . , 110-N and circuitry for providing a translation layer between a host and the memory system 104. Thus, a controller could selectively couple an I/O connection (not shown in FIG. 1) of a solid state memory device 110-1, . . . , 110-N to receive the appropriate signal at the appropriate I/O connection at the appropriate time. Similarly, the communication protocol between a host and the memory system 104 may be different than what is required for access of a solid state memory device 110-1, . . . , 110-N. Controller 108 could then translate the commands received from a host into the appropriate commands to achieve the desired access to a solid state memory device 110-1, . . . , 110-N.

The host I/F 114 can include a physical interface to couple the memory system 104 to a host. The host I/F 114 can include a peripheral component interconnect express (PCIe) circuit providing a physical layer, link layer, and transport or transaction layer interface, e.g., where the host is configured to transmit information according to a PCIe standard. In a number of embodiments, the host I/F 114 can be coupled to host-memory translation circuitry 116.

In general, the host I/F 114 can include circuitry that is responsible for converting command packets received from the host, e.g., from a PCIe bus, into command instructions for the host-memory translation circuitry 116 and for converting host-memory translation responses into host commands for transmission to the requesting host. For example, the host I/F 114 can construct SATA command packets from PCIe based transaction layer packets.

The host-memory translation circuitry 116 can be coupled to the host I/F 114, to the memory management circuitry 118, and/or to the switch 120. The host-memory translation circuitry 116 can be configured to translate host addresses to memory addresses, e.g., addresses associated with a received command such as a read and/or write command. The host-memory translation circuitry 116 can include error detection/correction circuitry, such as RAID exclusive or (XOR) circuitry. The RAID XOR circuitry can calculate parity information based on information received from the host I/F 114.

The memory management circuitry 118 can be coupled to the host-memory translation circuitry 116 and/or to the switch 120. The memory management circuitry 118 can control a number of processes including, but not limited to, initialization, wear leveling, e.g., garbage collection and/or block reclamation, and error correction, e.g., via operation of a processor.

Control circuitry 124 includes power control manager 126, processor 128, and channel controllers 130-1, . . . , 130-N. The control circuitry 124, e.g., non-volatile memory control circuitry, can be coupled to the switch 120 and to a number of non-volatile memory devices 110. In some embodiments, the controller 108 can include control circuitry, such as channel controllers 130-1, . . . , 130-N, for all memory channels. Control circuitry 124 can include processor 128 to execute instructions, e.g., software and/or firmware, according to a number of embodiments of the present disclosure. While the control circuitry 124 can include a processor 128, a number of embodiments of the present disclosure provide for control of memory operations in circuitry, e.g., hardware, without relying on the execution of instructions, e.g., software and/or firmware, by the processor 128. Such embodiments can provide for faster memory operations relative to some previous approaches that rely more heavily on a processor to control memory operations.

The control circuitry 124 can receive commands, such as read, write, and/or erase commands, from a host, e.g., via host I/F 114, and/or commands from memory management circuitry 118, e.g., in association with wear leveling operations. The commands received by the control circuitry 124 can be separated into a number of combinations of a number of phases by the processor 128 and/or hardware on the control circuitry 124. The combination of phases for each of the commands received by the control circuitry can be assigned to a memory device for execution, such as memory device 110-1 or 110-N. The channel controller 130 associated with the memory devices that are assigned the combination of phases for the commands, such as channel controller 130-1 associated with memory device 110-1 or channel controller 130-N associated with memory device 110-N, can be used for execution of the combinations of phases corresponding to the respective commands. The channel controllers can include a number of LUN controllers, that are associated with each LUN on a channel, to execute the combinations of phases corresponding to the commands. Power consumption information for the phases corresponding to the commands can be stored in a data structure, e.g., look-up table 140, on the channel controller 130, for instance, and can be used by a power control manager 126 in association with authorizing execution of the phases. The power consumption information for the phases stored in the data structure can be programmable. The power consumption information can be programmed in the data structure based on the clock speed of the apparatus, the type of bus of the apparatus, and/or the type of memory devices of the apparatus, for instance.

The channel controller 130 can request permission from the power control manager 126 to execute a number of phases corresponding to a command. The channel controller can send power consumption information found in data structure 140 in the requests for authorization to execute the phases. The power control manager 126 can authorize execution of the number of phases associated with the requests from the channel controller 130. The authorization to execute the number of phases can be based on an analysis of the power consumption information of the number of phases. The power consumption information can include an amount of power credits of each of the phases. The number of power credits can correspond to an amount of power consumed upon execution of the phase. Power control manager 126 can manage power consumption by authorizing, e.g. granting, execution of a number of phases when the sum of the power credits for the number of phases is less than or equal to a threshold amount of power credits for the memory system. For example, a memory system can have a threshold power credit amount of 250 power credits. In this example, the memory system will be consuming a desired average amount of power when phases having a sum of 250 power credits are being executed at any given time. The power control manager 126 can authorize execution of a combination of phases whose sum of power credits is less than or equal 250 power credits. As execution of authorized phases is completed by the memory system, the power control manager can grant execution for additional phases to maintain the amount of authorized power credits at or below the threshold of 250 power credits.

In a number of embodiments, if a number of power credits are authorized, but not used during the execution of a phase, the power control manager can authorize an amount of additional power credits above a threshold, such as 250 power credits, for example, that is equal to the number of power credits that were authorized, but not used during the execution of a phase. The authorization of additional power credits can account for the number of power credits that were authorized, but not used during the execution of a phase by temporarily authorizing an amount of power credits for execution that is above a threshold, which can help to maintain a desired average power consumption by the memory system.

In a number of embodiments, the power control manager can analyze requests for authorization to execute phases in the order that they are received by the power control manager. The power control manager can analyze the amount of power credits associated with a request and authorize execution of a phase if the authorization does not cause the total number of authorized power credits to be greater than a threshold. If authorization of a request would cause the total number of authorized power credits to be greater than the threshold, the request can be put on hold and the next request received by the power control manager can be analyzed for authorization. The requests that are put on hold can be reanalyzed for authorization after execution of a number of authorized commands has completed, thus increasing the amount of power credits available for authorization.

For example, consider a power control manager that has authorized 25 data transfer phases for execution each having 10 power credits corresponding thereto. If two of the data transfer phases only used 5 power credits each during execution of the phases, there are 10 power credits that were authorized for use, but not used during the execution of the 25 authorized phases. The power control manager can authorize an additional 10 power credits above the threshold to compensate for the 10 power credits that were authorized for use, but not used during the execution of the 25 authorized phases. Therefore, the power control manager can authorize 260 power credits for execution temporarily to compensate for the 10 power credits that were authorized, but not used during the execution of the 25 phases previously authorized. The temporary authorization of an amount of power credits above a threshold can help maintain power consumption to a desired average power consumption, which is associated with the threshold, such as 250 power credits for example.

In a number of embodiments, for example, consider a power control manager that has authorized 24 data transfer phases for execution each having 10 power credits corresponding thereto. If the next phase to be analyzed by the power control manager has 15 power credits corresponding thereto, which would cause the total number of authorized power credits to be above a threshold of 250 power credits, the phase is placed on hold. The phase having 15 power credits corresponding thereto is placed on hold until a number of 24 data transfer phases that have received authorization are executed, then the phase having 15 power credits corresponding thereto on hold is reanalyzed to determine if there are sufficient power credits available to authorize the phase having 15 power credits corresponding thereto. If there are insufficient power credits available to authorize the phase having 15 power credits corresponding thereto, the phase is placed on hold again.

The memory system 104 illustrated in FIG. 1 can include additional circuitry beyond what is illustrated. The detail of the memory system 104 illustrated in FIG. 1 has been reduced so as not to obscure embodiments of the present disclosure. For example, the memory system 104 can include address circuitry to latch address signals provided over I/O connections through I/O circuitry. Address signals can be received and decoded by a row decoder and a column decoder to access the solid state memory devices 110-1, ..., 110-N. It will be appreciated by those skilled in the art that the number of address input connections can depend on the density and architecture of the solid state memory devices 110-1, ..., 110-N.

Figure 2:
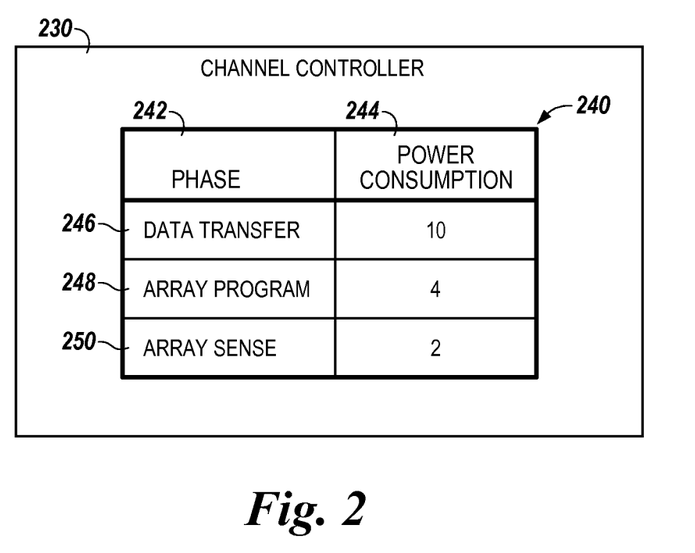
FIG. 2 illustrates a channel controller of a memory system in accordance with a number of embodiments of the present disclosure.

FIG. 2 illustrates a channel controller 230 of a memory system in accordance with a number of embodiments of the present disclosure. Channel controller 230 can be associated with a channel that couples the channel controller 230 to memory devices, such as memory devices 110-1, ..., 110-N in FIG. 1.

In a number of embodiments, channel controller 230 can receive a command comprising a number of phases for execution. The channel controller 230 can execute the number of phases by locating power consumption information for the number of phases in a data structure, e.g., look-up table 240, which can be stored in memory on the channel controller 230, for instance. The look-up table 240 can include power consumption information for each of the number of phases corresponding to a command. Each command can be comprised of a combination of the phases stored in look-up table 240.

The channel controller 230 can send a request to a power control manager, e.g., power control manager 126 shown in FIG. 1, for authorization to execute the number of phases corresponding to the commands received at channel controller 230. The request can include the power consumption information, e.g., power credits, for each of the number of phases. Upon receiving authorization from the power control manager to execute the number of phases, the channel controller 230 can execute the phases and send a notification to the power control manager when the phases have been executed so the power control manager can authorize additional phases for execution.

The data structure in channel controller 230 can be a look-up table 240, and includes information that identifies a number of phases 242 and power consumption information 244 for the number of phases. The power consumption information can include an amount of power credits, associated with performing a particular phase. Look-up table 240 can identify a number of phases 242 that correspond to a number of commands that can be performed by a memory system. For example, execution of a command can comprise execution of a number of phases each of which are executed to complete the execution of the command. Look-up table 240 can include power consumption information for each of the phases 242 corresponding to a number of particular commands executable by a memory system.

In FIG. 2, look-up table 240 includes power consumption information for a data transfer phase 246, an array program phase 248, and an array sense phase 250. In this example, data transfer phase 246 is assigned 10 power credits, array program phase 248 is assigned 4 power credits, and array sense phase is assigned 2 power credits. The amount of power credits can indicate the amount of power consumed during execution of the particular phase. For example, a data transfer phase having 10 power credits assigned thereto can indicate that more power is consumed during execution of the data transfer phase than during execution of an array sense phase having 2 power credits assigned thereto. The power consumption information 246 provided in look-up table 240 can include information that identifies the amount, e.g., whether actual or relative, of power consumed in association with executing a phase of a command.

In a number of embodiments, a channel controller 230 can receive a command that is separated into a number of phases. The channel controller 230 can locate power consumption information for the number of phases of the command in the look-up table 240. For example, a particular command may be comprised of a data transfer phase 246 and an array program phase 248. The channel controller 230 can determine that data transfer phase 246 has 10 power credits assigned thereto and array program phase 248 has 4 power credits assigned thereto. The channel controller 230 can send a number of requests to execute data transfer phase 246 and/or array program phase 248 to a power control manager, such as power control manager 126 in FIG. 1, and the number of requests can include the power consumption information for data transfer phase 246 and/or array program phase 248. The power control manager can perform an analysis of the number of requests it receives taking into consideration the power consumption information for the phases that have been requested. Based on the analysis of the requests, the power control manager can authorize, e.g., grant, the request of the channel controller to perform data transfer phase 246 and/or array program phase 248. The channel controller 230 can then execute the command by executing data transfer phase 246 and/or array program phase 248.

Figure 3:
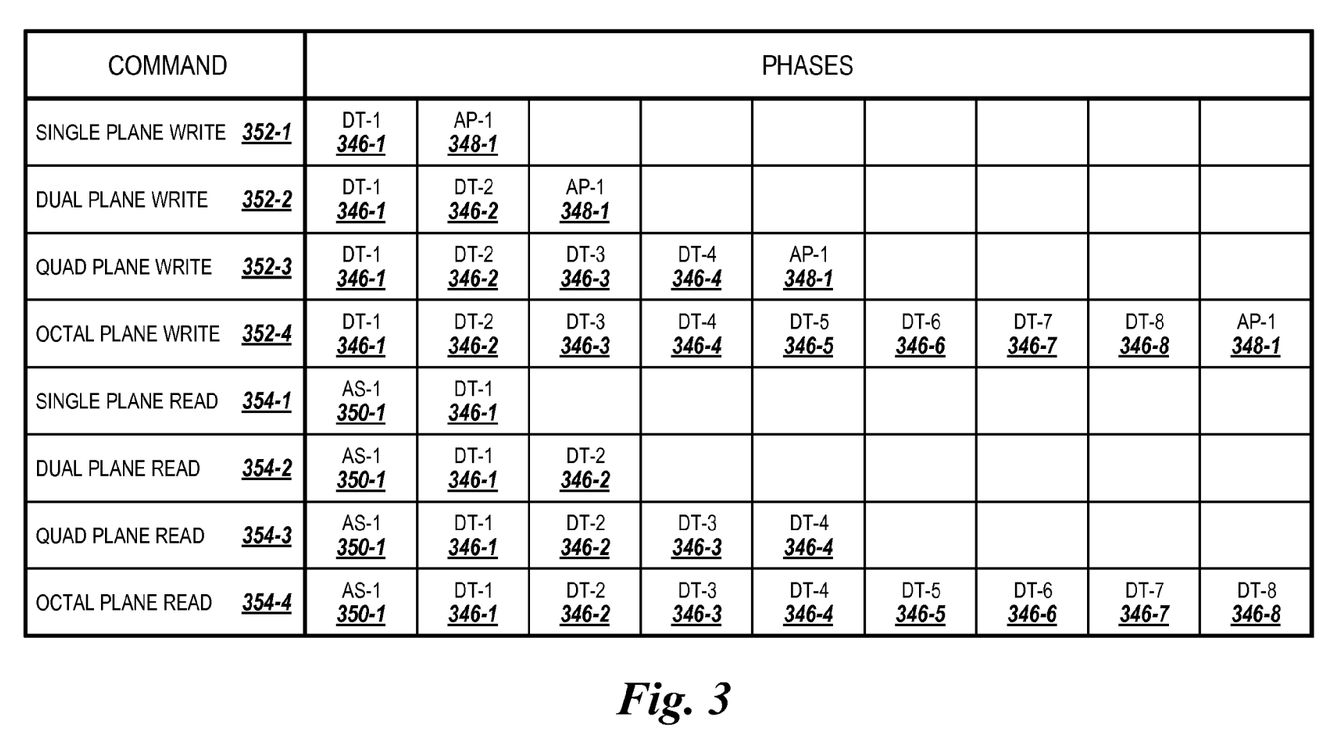
FIG. 3 illustrates a number of commands comprising a number of phases in accordance with a number of embodiments of the present disclosure.

FIG. 3 illustrates a number of commands comprised of a number of phases in accordance with a number of embodiments of the present disclosure. In FIG. 3, a number of write commands and a number of read commands are illustrated. Write and read commands can be comprised of combinations of data transfer (DT) phases, array program (AP) phases, and/or array sense (AS) phases, for instance.

In FIG. 3, single plane write command 352-1 is comprised of data transfer phase 346-1 (DT-1), in which data is transferred to a first plane, and an array program phase 348-1 (AP-1), in which data is written to the first plane. Dual plane write command 352-2 is comprised of data transfer phases 346-1 (DT-1) and 346-2 (DT-2), in which data is transferred to a first and a second plane, and array program phase 348-1 (AP-1), in which data is written to the first and second planes. Quad plane write command 352-3 is comprised of data transfer phases 346-1 (DT-1), 346-2 (DT-2), 346-3 (DT-3), 346-4 (DT-4), in which data is transferred to a first, a second, a third, and a fourth plane, and an array program phase, 348-1 (AP-1), in which data is written to the first, second, third, and fourth planes. Octal plane write command 352-4 is comprised of data transfer phases 346-1 (DT-1), 346-2 (DT-2), 346-3 (DT-3), 346-4 (DT-4), ..., 346-8 (DT-8), in which data is transferred to a first, a second, a third, a fourth, a fifth, a sixth, a seventh, and an eighth plane and an array program phase, AP-1 (348-1), in which data is written to the first, second, third, fourth, fifth, sixth, seventh, and eighth planes.

In FIG. 3, single plane read command 354-1 is comprised of array sense phase 350-1 (AS-1), in which data is read from a first plane, and data transfer phase 346-1 (DT-1), in which data is transferred from the first plane. Dual plane read command 354-2 is comprised of array sense phase 350-1 (AS-1), in which data is read from a first and a second plane, and data transfer phases 346-1 (DT-1) and 346-2 (DT-2), in which data is transferred from the first and second planes. Quad plane read command 354-3 is comprised of array sense phase 350-1 (AS-1), in which data is read from a first, a second, a third, and a fourth plane, and data transfer phases 346-1 (DT-1), 346-2 (DT-2), 346-3 (DT-3), 346-4 (DT-4), in which data is transferred from the first, second, third, and fourth planes. Octal plane read command 354-4 is comprised array sense phase 350-1 (AS-1), in which data is read from a first, a second, a third, a fourth, a fifth, a sixth, a seventh, and an eighth plane, and data transfer phases 346-1 (DT-1), 346-2 (DT-2), 346-3 (DT-3), 346-4 (DT-4), . . . , 346-8 (DT-8), in which data is transferred from the first, second, third, fourth, fifth, sixth, seventh, and eighth planes.

In a number of embodiments, a controller can receive a command, such as quad plane write command 352-3, and separate the command 352-3 into phases, e.g., data transfer phases 346-1, 346-2, 346-3, and 346-4, and array program phase 348-1, as indicated in FIG. 3. The phases 346-1, 346-2, 346-3, 346-4, and 348-1 for quad plane write command 352-3 can be assigned to a channel controller, such as channel controller 130-1 in FIG. 1, for execution on the associated channel. The channel controller can locate power consumption information for each of the phases 346-1, 346-2, 346-3, 346-4, and 348-1 of command 352-2 in a data structure, such as look-up table 140 in FIG. 1 to determine that phases 346-1, 346-2, 346-3, and 346-4 each have 10 power credits assigned thereto and phase 348-1 has 4 power credits assigned thereto. The channel controller can send requests to a power control manager for authorization to execute phases 346-1, 346-2, 346-3, 346-4, and 348-1 of command 352-2. The requests can include a request for 10 power credits to execute phase 346-1, a request for 10 power credits to execute phase 346-2, a request for 10 power credits to execute phase 346-3, a request for 10 power credits to execute phase 346-4, and a request for 4 power credits to execute phase 348-1.

In a number of embodiments, the power control manager can analyze the requests in the order that they are received by the power control manager. The power control manager can analyze the request associated with phase 346-1 to determine if authorization of the 10 power credits requested for execution of phase 346-1 causes the total number of authorized power credits to be greater than a threshold. If the authorization of the 10 power credits requested for execution of phase 346-1 does not cause the total number of authorized power credits to be greater than a threshold, phase 346-1 can be authorized for execution by the power control manager. If the authorization of the 10 power credits requested for execution of phase 346-1 causes the total number of authorized power credits to be greater than a threshold, phase 346-1 can be placed on hold and reanalyzed for authorization after execution of a number of authorized phases has completed, thus increasing the amount of power credits available for authorization.

The power control manager can also analyze the request associated with phase 346-2 to determine if authorization of the 10 power credits requested for execution of phase 346-2 causes the total number of authorized power credits to be greater than the threshold. If the authorization of the 10 power credits requested for execution of phase 346-2 does not cause the total number of authorized power credits to be greater than a threshold, phase 346-2 can be authorized for execution by the power control manager. If the authorization of the 10 power credits requested for execution of phase 346-2 causes the total number of authorized power credits to be greater than the threshold, phase 346-2 can be placed on hold and reanalyzed for authorization after execution of a number of authorized phases have completed, thus increasing the amount of power credits available for authorization.

The power control manager will analyze the request associated with phase 346-3 to determine if authorization of the 10 power credits requested for execution of phase 346-3 causes the total number of authorized power credits to be greater than the threshold. If the authorization of the 10 power credits requested for execution of phase 346-3 does not cause the total number of authorized power credits to be greater than the threshold, phase 346-3 can be authorized for execution by the power control manager. If the authorization of the 10 power credits requested for execution of phase 346-3 causes the total number of authorized power credits to be greater than the threshold, phase 346-3 can be placed on hold and reanalyzed for authorization after execution of a number of authorized phases have completed, thus increasing the amount of power credits available for authorization.

The power control manager can also analyze the request associated with phase 346-4 to determine if authorization of the 10 power credits requested for execution of phase 346-4 causes the total number of authorized power credits to be greater than the threshold. If the authorization of the 10 power credits requested for execution of phase 346-4 does not cause the total number of authorized power credits to be greater than a threshold, phase 346-4 can be authorized for execution by the power control manager. If the authorization of the 10 power credits requested for execution of phase 346-4 causes the total number of authorized power credits to be greater than a threshold, phase 346-4 can be placed on hold and reanalyzed for authorization after execution of a number of authorized phases have completed, thus increasing the amount of power credits available for authorization.

The power control manager can also analyze the request associated with phase 348-1 to determine if authorization of the 4 power credits requested for execution of phase 348-1 causes the total number of authorized power credits to be greater than the threshold. If the authorization of the 4 power credits requested for execution of phase 348-1 does not cause the total number of authorized power credits to be greater than a threshold, phase 348-1 can be authorized for execution by the power control manager. If the authorization of the 4 power credits requested for execution of phase 348-1 causes the total number of authorized power credits to be greater than the threshold, phase 348-1 can be placed on hold and reanalyzed for authorization after execution of a number of authorized phases have completed, thus increasing the amount of power credits available for authorization.

CONCLUSION

The present disclosure includes apparatuses and methods for power consumption control. A number of embodiments include determining power consumption information for each phase in a combination of phases of a command, and authorizing execution of at least one of the phases in the combination based, at least partially, on the power consumption information determined for the at least one of the phases.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present.

As used herein, the term "and/or" includes any and all combinations of a number of the associated listed items.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for controlling power consumption in an apparatus, comprising:
   determining power consumption information for each phase in a combination of phases of a command, wherein the command is for performing an operation on a memory device; and
   authorizing execution of at least one of the phases in the combination based, at least partially, on the power consumption information determined for the at least one of the phases.

2. The method of claim 1, including authorizing execution of the at least one of the phases, such that an average power consumption is maintained.

3. The method of claim 1, wherein determining power consumption information includes determining power consumption information for a data transfer phase.

4. The method of claim 1, wherein determining power consumption information includes determining power consumption information for an array program phase.

5. The method of claim 1, wherein determining power consumption information includes determining power consumption information for an array sense phase.

6. The method of claim 1, wherein authorizing execution of at least one of the phases includes authorizing execution of at least one of the phases based on an amount of previously authorized, but unused power credits.

7. The method of claim 1, wherein authorizing execution of at least one of the phases includes authorizing execution of phases in the combination whose sum of associated power credits is less than or equal to a threshold amount of power credits available for authorization.

8. The method of claim 1, wherein authorizing execution of at least one of the phases includes authorizing execution of phases of the combination whose sum of associated power credits is greater than a threshold amount of power credits available for authorization to compensate for a number of power credits that were authorized for use, but not used to execute a previously authorized phase.

9. The method of claim 1, wherein the method includes authorizing execution of the at least one of the phases via a controller.

10. A method for controlling power consumption in an apparatus, comprising:
    receiving a request to execute a number of phases of a command, wherein the command is for performing an operation on a memory device;
    analyzing power consumption information for the number of phases; and
    authorizing execution of at least one of the number of phases based on an amount of power consumption available to execute the number of phases and the analysis of the power consumption information for the number of phases.

11. The method of claim 10, wherein analyzing power consumption information for the number of phases includes analyzing power consumption information for the number of phases with a power control manager.

12. The method of claim 10, wherein authorizing execution includes authorizing a channel controller to execute the at least one of the number phases.

13. The method of claim 10, wherein the amount of power consumption available to execute the number of phases is indicated by an amount of power credits available for authorization.

14. The method of claim 10, wherein authorizing execution of at least one of the number of phases maintains a particular desired average power consumption.

15. The method of claim 10, wherein the method includes placing at least one of the number of phases on hold based on the amount of power consumption available to execute the number of phases.

16. A method for controlling power consumption in an apparatus, comprising:
    receiving a command, wherein the command is separable into a combination of phases and the command is for performing an operation on a memory device;
    sending a number of requests to a power control manager for authorization to execute the combination of phases, wherein each of the number of requests is associated with a respective phase of the combination of phases; and
    receiving a number of responses to the number of requests, wherein the number of responses authorize execution of at least one phase of the combination of phases based, at least partially, on power consumption information, and wherein each of the number of responses is associated with a respective phase of the combination of phases.

17. The method of claim 16, wherein the method includes retrieving the power consumption information from a data structure.

18. The method of claim 16, wherein sending the number of requests to the power control manager for authorization to execute the combination of phases includes sending the phase power consumption information in the number of requests.

19. The method of claim 16, wherein receiving the number of responses includes receiving authorization to execute the at least one phase of the combination of phases responsive to a determination that a sum of power credits corresponding to a number of phases that includes the at least one phase of the combination of phases is greater than a threshold amount of power credits if a number of power credits that were previously authorized for use have not been used.

20. The method of claim 16, wherein receiving the number of responses includes receiving authorization to execute the at least one phase of the combination of phases responsive to a determination that a sum of power credits corresponding to the at least one phase of the combination of the number of phases is less than or equal to a threshold amount of power credits.

21. The method of claim 16, wherein the combination of phases includes a data transfer phase, an array program phase, and/or an array sense phase.

22. The method of claim 16, wherein the method includes separating the command into the combination of phases via a controller.

23. A method for controlling power consumption in an apparatus, comprising:
- receiving a number of requests to execute a number of phases of a number of commands, wherein the number of command are for performing operations on a memory device and wherein the number of requests include power consumption information for the number of phases, the power consumption information corresponding to an amount of power consumed in executing the number of phases;
- determining if execution of the number of phases will result in an amount of power consumption authorized being greater than a threshold amount of power consumption; and
- authorizing execution of a first number of the number of phases responsive to a determination that authorization of execution of the first number of phases will result in the amount of power consumption authorized being less than or equal to the threshold amount of power consumption, and placing a second number of the number of phases on hold.

24. The method of claim 23, wherein authorizing execution of the first number of the number of phases includes authorizing execution of a combination of the number of phases corresponding to a particular command of the number of commands.

25. The method of claim 23, wherein the method includes determining if authorization of execution of the second number of the number of phases will result in an amount of power consumption authorized being greater than a threshold amount of power consumption after execution of a portion of the first number of the number of phases has completed.

26. The method of claim 23, wherein each of the number of commands comprises a respective combination of phases including a data transfer phase, an array program phase, and/or an array sense phase.

27. An apparatus, comprising:
- an array of memory cells; and
- a controller coupled to the array and configured to:
  - determine power consumption information for each phase in a combination of phases of a command, wherein the command is for performing an operation on the array of memory cells; and
  - authorize at least one of phases in the combination for execution based at least partially the power consumption information determined for the at least one of the phases.

28. The apparatus of claim 27, wherein the combination of phases includes a data transfer phase, an array program phase, and/or an array sense phase.

29. The apparatus of claim 27, wherein a power control manager on the controller is configured to determine power consumption information.

30. The apparatus of claim 27, wherein the command comprises a write command comprised of a number of data transfer phases and an array program phase.

31. The apparatus of claim 27, wherein the command comprises a read command comprised of an array sense phase and a number of data transfer phases.

32. The apparatus of claim 27, wherein the controller is configured to authorize the at least one of the phases for execution to maintain a desired average power consumption.

33. The apparatus of claim 27, wherein the controller is configured to authorize the at least one of the phases for execution to compensate for a number of power credits that were authorized for use, but not used to execute a previously authorized phase.

34. An apparatus, comprising:
- an array of memory cells; and
- a controller coupled to the array and configured to:
  - receive a command comprising a combination of phases, wherein the command is for performing an operation on the array of memory cells;
  - analyze power consumption information for the phases;
  - authorize execution of a number of phases based on an amount of power consumption available to execute the number of the phases and the power consumption information for the number of the phases.

35. The apparatus of claim 34, wherein the controller is configured to place at least one of the phases on hold based on the amount of power consumption available to execute the number of the phases.

36. The apparatus of claim 34, wherein the controller is configured to authorize execution of the at least one of the phases placed on hold after at least a portion of the number of the phases have been executed.

37. The apparatus of claim 34, wherein the controller is configured to authorize execution of the number of the phases to maintain a desired average power consumption.

38. The apparatus of claim 34, wherein the command comprises a write command having a number of data transfer phases and an array program phase.

39. The apparatus of claim 34, wherein the command comprises a read command having an array sense phase and a number of data transfer phases.

* * * * *

UNITED STATES PATENT AND TRADEMARK OFFICE
CERTIFICATE OF CORRECTION

PATENT NO. : 8,848,478 B2
APPLICATION NO. : 13/625104
DATED : September 30, 2014
INVENTOR(S) : Krishnam R. Datla et al.

Page 1 of 1

It is certified that error appears in the above-identified patent and that said Letters Patent is hereby corrected as shown below:

In the Claims,

In column 12, line 25, in Claim 12, delete "number phases." and insert -- number of phases. --, therefor.

In column 14, line 4, in Claim 27, delete "partially" and insert -- partially on --, therefor.

Signed and Sealed this
Twenty-third Day of December, 2014

Michelle K. Lee
*Deputy Director of the United States Patent and Trademark Office*